(12) United States Patent
Enicks et al.

(10) Patent No.: US 7,300,849 B2
(45) Date of Patent: Nov. 27, 2007

(54) BANDGAP ENGINEERED MONO-CRYSTALLINE SILICON CAP LAYERS FOR SIGE HBT PERFORMANCE ENHANCEMENT

(75) Inventors: Darwin Gene Enicks, Colorado Springs, CO (US); Damian Carver, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/266,797

(22) Filed: Nov. 4, 2005

(65) Prior Publication Data

US 2007/0111428 A1    May 17, 2007

(51) Int. Cl.
*H01L 21/331* (2006.01)
(52) U.S. Cl. .................... 438/316; 438/312
(58) Field of Classification Search ............... 438/312, 438/316, 337; 257/194, 197
See application file for complete search history.

(56) References Cited

U.S. PATENT DOCUMENTS

| | | | |
|---|---|---|---|
| 3,888,518 A | 6/1975 | Delessert | |
| 4,352,532 A | 10/1982 | Hardin | |
| 4,383,547 A | 5/1983 | Lorenz et al. | |
| 4,437,479 A | 3/1984 | Bardina et al. | |
| 4,771,326 A | 9/1988 | Curran | |
| 4,852,516 A | 8/1989 | Rubin et al. | |
| 5,001,534 A | 3/1991 | Lunardi et al. | |
| 5,006,912 A | 4/1991 | Smith et al. | |
| 5,137,047 A | 8/1992 | George | |
| 5,247,192 A | 9/1993 | Nii | |
| 5,316,171 A | 5/1994 | Danner, Jr. et al. | |
| 5,316,958 A | 5/1994 | Meyerson | |
| 5,329,145 A | 7/1994 | Nakagawa | |
| 5,331,186 A | 7/1994 | Morizuka | |
| 5,352,912 A | 10/1994 | Crabbe et al. | |
| 5,412,233 A * | 5/1995 | Dubon-Chevallier et al. | 257/197 |
| 5,426,316 A | 6/1995 | Mohammad | |
| 5,440,152 A | 8/1995 | Yamazaki | |
| 5,449,294 A | 9/1995 | Rench et al. | |
| 5,453,124 A | 9/1995 | Moslehi et al. | |
| 5,494,836 A | 2/1996 | Imai | |
| 5,506,427 A | 4/1996 | Imai | |
| 5,523,243 A | 6/1996 | Mohammad | |
| 5,583,059 A | 12/1996 | Burghartz | |
| 5,656,514 A | 8/1997 | Ahlgren | |
| 5,665,614 A | 9/1997 | Hafizi et al. | |
| 5,668,388 A * | 9/1997 | Delage et al. | 257/197 |

(Continued)

OTHER PUBLICATIONS

Phil Danielson, "Desorbing Water in Vacuum Systems: Bakeout or UV?", A Journal of Practical and Useful Vacuum Technology, Jan. 2001, Available at: http://www.vacuumlab.com/Articles/VacLab22%20.pdf (Visited: Jul. 14, 2005).

(Continued)

*Primary Examiner*—Roy Karl Potter
(74) *Attorney, Agent, or Firm*—Sawyer Law Group LLP (57) ABSTRACT

A method for fabricating a heterojunction bipolar transistor (HBT) is provided. The method includes providing a substrate including a collector region; forming a compound base region over the collector region; forming a cap layer overlying the compound base region including doping the cap layer with a pre-determined percentage of at least one element associated with the compound base region; and forming an emitter region over the cap layer.

13 Claims, 7 Drawing Sheets

U.S. PATENT DOCUMENTS

| | | | |
|---|---|---|---|
| 5,729,033 | A | 3/1998 | Hafizi |
| 5,798,277 | A | 8/1998 | Ryum et al. |
| 5,821,149 | A | 10/1998 | Schuppen et al. |
| 5,881,476 | A | 3/1999 | Strobush et al. |
| 5,912,481 | A | 6/1999 | El-Sharawy et al. |
| 5,962,880 | A | 10/1999 | Oda et al. |
| 5,972,783 | A | 10/1999 | Arai et al. |
| 5,992,463 | A | 11/1999 | Redemann et al. |
| 6,074,698 | A | 6/2000 | Sakurai et al. |
| 6,099,599 | A | 8/2000 | Wu |
| 6,171,920 | B1 | 1/2001 | El-Sharawy et al. |
| 6,199,255 | B1 | 3/2001 | Wang et al. |
| 6,325,886 | B1 | 12/2001 | Harris et al. |
| 6,349,744 | B1 | 2/2002 | Grosshart |
| 6,352,591 | B1 | 3/2002 | Yieh et al. |
| 6,410,396 | B1 * | 6/2002 | Casady et al. ............... 438/312 |
| 6,423,990 | B1 | 7/2002 | El-Sharawy et al. |
| 6,442,867 | B2 | 9/2002 | Pressnall et al. |
| 6,459,104 | B1 | 10/2002 | Schuegraf |
| 6,509,242 | B2 | 1/2003 | Frei et al. |
| 6,531,369 | B1 | 3/2003 | Ozkan et al. |
| 6,541,346 | B2 * | 4/2003 | Malik .......................... 438/316 |
| 6,555,874 | B1 | 4/2003 | Hsu et al. |
| 6,563,145 | B1 | 5/2003 | Chang et al. |
| 6,598,279 | B1 | 7/2003 | Morgan |
| 6,607,605 | B2 | 8/2003 | Tan |
| 6,667,489 | B2 | 12/2003 | Suzumura et al. |
| 6,670,654 | B2 | 12/2003 | Lanzerotti et al. |
| 6,696,710 | B2 | 2/2004 | Moll et al. |
| 6,756,615 | B2 | 6/2004 | Yoshioka et al. |
| 6,759,697 | B2 | 7/2004 | Toyoda et al. |
| 6,764,918 | B2 | 7/2004 | Loechelt |
| 6,794,237 | B2 | 9/2004 | Babcock et al. |
| 6,797,578 | B1 | 9/2004 | U'Ren |
| 6,806,513 | B2 | 10/2004 | Chau et al. |
| 6,861,323 | B2 | 3/2005 | Shideler |
| 6,861,324 | B2 | 3/2005 | Kalnitsky et al. |
| 6,870,204 | B2 | 3/2005 | Torvik et al. |
| 7,183,576 | B2 | 2/2007 | Chu et al. |
| 2002/0117657 | A1 | 8/2002 | Moll et al. |
| 2002/0135761 | A1 | 9/2002 | Powell et al. |
| 2002/0149033 | A1 | 10/2002 | Wojtowicz |
| 2002/0155670 | A1 | 10/2002 | Malik |
| 2003/0022528 | A1 | 1/2003 | Todd |
| 2003/0122154 | A1 | 7/2003 | Babcock et al. |
| 2003/0162370 | A1 | 8/2003 | Sukegawa et al. |
| 2003/0201461 | A1 | 10/2003 | Sato et al. |
| 2003/0203583 | A1 | 10/2003 | Malik |
| 2004/0123882 | A1 | 7/2004 | Olmer et al. |
| 2004/0188802 | A1 | 9/2004 | Babcock et al. |

OTHER PUBLICATIONS

Phil Danielson, "Sources of Water Vapor in Vacuum Systems", A Journal of Practical and Useful Vacuum Technology, Sep. 2000, Available at: http://www.vacuumlab.com/Articles/Sources%20of%20Water%20Vapor.pdf (Visited: Jul. 14, 2005).

Sherman Rutherford, "The Benefits of Viton Outgassing", Duniway Stockroom Corp., Feb. 1997, Available at: http://www.duniway.com/images/pdf/pg/viton-out-gassed-orings.pdf (Visited: Jul. 21, 2005).

Viton Gaskets Brochure, Duniway Stockroom Corp. Available at: http://www.duniway.com/images/pdf/pg/p-sp05b-viton-gaskets.pdf (Visited: Jul. 14, 2005).

"Outgassing and Weight Loss of Elastomers", Problem Solving Products, Inc., 1997-2005, Available at: http://www.pspglobal.com/outgassing-elastomers.html (Visited: Jul. 14, 2005).

"O-Ring Performance", Kurt J. Lesker Comp., 1996-2004, Available at: http://www.lesker.com/newweb/Vacuum_Components/O_Ring_Seals/O-ring_performance.cfm?CFID=266017&CFTOKEN=49827656 (Visited: Jul. 14, 2005).

Phil Danielson, "The Effects of Humidity on Vacuum Systems", A Journal of Practical and Useful Vacuum Technology, Jun. 2001, Available at: http://www.vacuumlab.com/Articles/VacLab27.pdf (Visited: Jul. 14, 2005).

Robert Lowry, "Sources and Control of Volatile Gases Hazardous to Hermetic Electronic Enclosures", 1999, International Symposium on Advanced Packaging Materials, pp. 94-99.

Darwin Enicks, "A Study of Process-Induced Oxygen Updiffusion in Pseudomorphic Boron-Doped Sub-50 nm SiGeC Layers Grown by LPCVD", Electrochemical and Solid-State Letters, 2005, G286-G289.

Phil Danielson, "Understanding Water Vapor in Vacuum Systems", Microelectronic Manufacturing and Testing, Jul. 1990, 2 pages.

Phil Danielson, "Gas Loads and O-Rings", A Journal of Practical and Useful Vacuum Technology, Aug 2000, Available at: http://www.vacuumlab.com/Articles/Gas%20Loads%20and%20O-Rings.pdf (Visited: Jul. 14, 2005), 4 pages.

T. Ghani et al., "Effect of Oxygen on Minority-Carrier Lifetime and Recombination Currents in Si(1-x)Ge(x) Heterostructure Devices", Appl. Phys. Lett., vol. 58, Mar. 12, 1991, pp. 1317-1319.

* cited by examiner

BANDGAP ENGINEERED MONO-CRYSTALLINE SILICON CAP LAYERS FOR SIGE HBT PERFORMANCE ENHANCEMENT

CROSS-REFERENCE TO RELATED APPLICATIONS

The present application is related to co-pending U.S. patent application Ser. No. 11/267,473 entitled Method and System for Controlled Oxygen Incorporation in Compound Semiconductor Films for Device Performance Enhancement filed on even date herewith and assigned to the assignee of the present application, and U.S. patent application Ser. No. 11/267,474 entitled Method and System for Providing a Heterojunction Bipolar Transistor having SiGe Extensions filed on even date herewith and assigned to the assignee of the present application, and U.S. patent application Ser. No. 11/267,553 entitled Bandgap and Recombination Engineered Emitter Layers for SiGe HBT Performance Optimization filed on even date herewith and assigned to the assignee of the present application.

FIELD OF THE INVENTION

The present invention relates generally to heterojunction bipolar transistors (HBTs), and methods for fabricating HBTs.

BACKGROUND OF THE INVENTION

Bipolar transistors are important components in, for example, logic circuits, communication systems, and microwave devices. One type of bipolar transistor is a silicon germanium (SiGe) heterojunction bipolar transistor (HBT). An SiGe HBT can typically handle signals of very high frequencies, e.g., up to several hundred GHz.

Strained SiGe is typically the film of choice for application in NPN HBTs. The SiGe is pseudomorphically grown to match the silicon lattice beneath the SiGe and is, therefore, in a compressively strained state. Subsequent to the pseudomorphic growth process (and in the same reactor) a cap layer (e.g., a silicon cap layer) can be grown. The silicon cap layer is conventionally doped n-type during the same process using either arsenic (As) or phosphorus (P)—e.g., arsine (AsH3) and phosphine (PH3) are typical dopant gases. The silicon cap layer maintains the SiGe in a strained condition during thermal anneal processes. Next to the silicon cap layer, a base-emitter heterojunction is typically formed within an SiGe HBT.

The base-emitter heterojunction within an NPN SiGe HBT results in a bandgap offset between the base and the emitter. The addition of germanium (Ge) to the bulk silicon lattice results in a bandgap reduction, which occurs mostly in the valence band. The mild valence bandgap offset also provides a potential barrier against hole diffusion from the base to the emitter. The combination of conduction band lowering and valence band lifting results in an increase in collector current and a reduction in base current and, consequently, a large increase in current gain. Such results permit an increase in base doping of an SiGE HBT to further reduce base resistance ($R_B$) for an enhanced Fmax (Fmax $\alpha 1/R_B$).

In addition to a large increase in lattice strain and the bandgap offset, the addition of germanium (Ge) to the silicon lattice of the base region of an SiGe HBT results in significant reduction in boron diffusion rates. Such a reduction permits for a narrower base width to reduce transit time and increase device speed of operation.

The requirement for a narrow boron doped (p-type) base region to achieve high transmit frequency (Ft) values results, however, in very high current gains along with greatly reduced breakdown voltages, especially the collector-to-emitter breakdown (BVCE0).

Accordingly, what is needed are methods of material engineering that will reduce current gains and increase the breakdown voltages, e.g., the BVCE0, of an HBT (e.g., an SiGe HBT) without adverse affect to device speed and power requirements. The present invention addresses such a need.

BRIEF SUMMARY OF THE INVENTION

In general, in one aspect, this specification describes a method for fabricating a heterojunction bipolar transistor (HBT). The method includes providing a substrate including a collector region; forming a compound base region over the collector region; forming a cap layer overlying the compound base region including doping the cap layer with a pre-determined percentage of at least one element associated with the compound base region; and forming an emitter region over the cap layer.

Particular implementations can include one or more of the following features. Forming a cap layer can further include doping the cap layer with a diffusion modulating impurity. The diffusion modulating impurity can be an impurity which alters interstitial and vacancy concentrations with the cap layer. Doping the cap layer with a diffusion modulating impurity can include doping the cap layer with carbon (C), oxygen (O), nitrogen (N), or fluorine (F). Doping the cap layer with carbon (C) or oxygen (O) can include doping the cap layer such that carbon (C) or oxygen (O) levels are substantially in the range of 5E16 atoms/cc to 1E21 atoms/cc. Forming a cap layer can further include doping the cap layer using a chemical vapor deposition method or ion implantation method. Forming a cap layer can include forming the cap layer at a temperature substantially ranging from 550° C. to 900° C.

In general, in another aspect, this specification describes a method for fabricating a heterojunction bipolar transistor (HBT) including providing a substrate including a collector region; depositing silicon germanium (SiGe) to form a base region over the collector region; forming a silicon cap layer overlying the base region including doping the silicon cap layer with a pre-determined percentage of germanium (Ge); and forming an emitter region over the silicon cap layer.

Particular implementations can include one or more of the following features. The method can further include forming a base/collector spacer between the base region and the collector region; and forming a base/emitter spacer between the base region and the emitter region. Forming a silicon cap layer can further include doping the silicon cap layer with a diffusion modulating impurity. Doping the silicon cap layer with a diffusion modulating impurity can include doping the silicon cap layer with carbon (C), oxygen (O), nitrogen (N), or fluorine (F). Doping the silicon cap layer with carbon (C) or oxygen (O) can include doping the silicon cap layer such that carbon (C) or oxygen (O) levels are substantially in the range of 5E16 atoms/cc to 1E21 atoms/cc. Forming a silicon cap layer can further include doping the silicon cap layer using a chemical vapor deposition method or ion implantation method. Forming a silicon cap layer can include forming the silicon cap layer at a temperature substantially ranging from 550° C. to 900° C.

In general, in another aspect, this specification describes a heterojunction bipolar transistor (HBT) including a substrate including a collector region, and a base region formed over the collector region. The base region includes silicon germanium (SiGe). The heterojunction bipolar transistor (HBT) further includes a silicon cap layer overlying the base region, the silicon cap layer being doped with a pre-determined percentage of germanium (Ge), and an emitter region formed over the silicon cap layer.

Implementations may provide one or more of the following advantages. The addition of germanium (Ge) and/or diffusion limiting impurities—e.g., carbon (C) and oxygen (O)—to one or more silicon cap layers within an SiGe HBT will add additional device-tuning capability to the SiGe HBT, while maintaining the benefits of conventional SiGe HBTs. The addition of germanium (Ge) to a silicon cap layer provides barrier height lifting within the valence band, therefore, increasing hole diffusion current. Such an increase in hole diffusion current results in a higher base current and reduced current gains of an SiGe HBT, which accordingly increases the breakdown voltages of an SiGe HBT without adversely affecting device operating speed. Additionally, the addition of germanium (Ge) to the silicon cap layer allows the designer to modify the strain energy within the SiGe base region to tailor the base recombination current. Such tailoring is the result of "controlled lattice defectivity" through strain modulation.

The details of one or more implementations are set forth in the accompanying drawings and the description below. Other features and advantages will be apparent from the description and drawings, and from the claims.

BRIEF DESCRIPTION OF SEVERAL VIEWS OF THE DRAWINGS

Like reference symbols in the various drawings indicate like elements.

DETAILED DESCRIPTION OF THE INVENTION

The present invention relates generally to heterojunction bipolar transistors (HBTs), and methods for fabricating HBTs. The following description is presented to enable one of ordinary skill in the art to make and use the invention and is provided in the context of a patent application and its requirements. Various modifications to the preferred implementations and the generic principles and feature described herein will be readily apparent to those skilled in the art. Thus, the present invention is not intended to be limited to the implementations shown but is to be accorded the widest scope consistent with the principles and features described herein.

In addition, manufacturing steps are described below with enough detail to show relationships between elements of the completed device. Many fabrication details are omitted from this description, with the understanding that those skilled in the art may employ as many of those details as are a called for in any particular design. Moreover, when description is given in this application of fabrication steps, those skilled in the art will realize that each such step may actually comprise one or more discrete steps and that other steps, not described herein, may be necessary to achieve specific applications of the invention.

Figure 1:
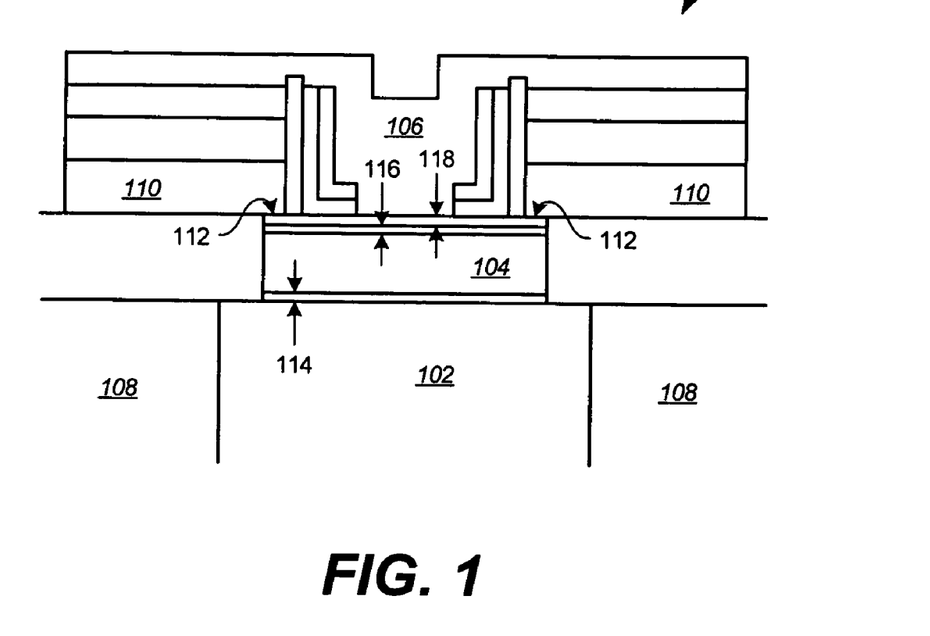
FIG. 1 is a schematic cross-sectional view of an SiGe HBT.

FIG. 1 illustrates a cross-sectional view of an SiGe HBT 100. SiGe HBT 100 includes a collector region 102, a base region 104, and an emitter region 106. Collector region 102 is formed within a substrate 108. In one implementation, collector region 102 is n-type. Base region 104 is a compound layer that can include p-type SiGe or SiGeC. Base region 104 can be formed as described in contemporaneously filed U.S. patent application—"Method and System For Providing a Heterojunction Bipolar Transistor Having Controlled Oxygen Incorporation" by Darwin Enicks and John Chaffee, attorney docket no. 3506P, which is incorporated by reference in its entirety.

A silicon base electrode 110 at least partially overlies base region 104, and a contact 112 connects base region 104 to silicon base electrode 110. In one implementation, emitter region 106 is n-type. Emitter region 106 can be doped with arsenic (As), phosphorous (P), or any other group V element. Emitter region 106 can also be formed to include one or more emitter layers as described in contemporaneously filed U.S. patent application—"Bandgap Engineered Emitter Layers for SiGe HBT Performance Optimization" by Darwin Enicks, attorney docket no. 3509P, which is incorporated by reference in its entirety.

In one implementation, base region 104 includes a base/collector spacer 114 and a base/emitter spacer 116. Base/collector spacer 114 separates base region 104 from collector region 102. Base/emitter spacer 116 separates base region 104 from emitter region 106.

Base region 104 further includes a mono-crystalline silicon cap layer 118. Though a single silicon cap layer 118 is shown, more than one silicon cap layer can be implemented within SiGe HBT 100. Silicon cap layer 118 is doped with germanium (Ge). The germanium (Ge) concentration within silicon cap layer 118 raises the valence band (as compared to a silicon cap layer containing only silicon) and permits additional hole diffusion from base region 104 to emitter region 106. In other implementations, silicon cap layer 118 can be doped with tin (Sn) or lead (Pb) to achieve similar results. Accordingly, base current is increased and current gain is reduced within SiGe HBT 100, which increases the collector-to-emitter breakdown (BVCE0) of SiGe HBT 100. Furthermore, the width or thickness of silicon cap layer 118 can be used to tailor the amount of hole diffusion from base region 104 to emitter region 106. Additionally, silicon cap layer 118 can be doped with carbon (C) or oxygen (O) (or other diffusion modulating impurities such as nitrogen (N) or fluorine (F)) to tailor carrier recombination rates, dopant diffusion rates, and dopant profiles in the vicinity of the base-emitter junction between base region 104 and emitter region 106.

Figure 2:
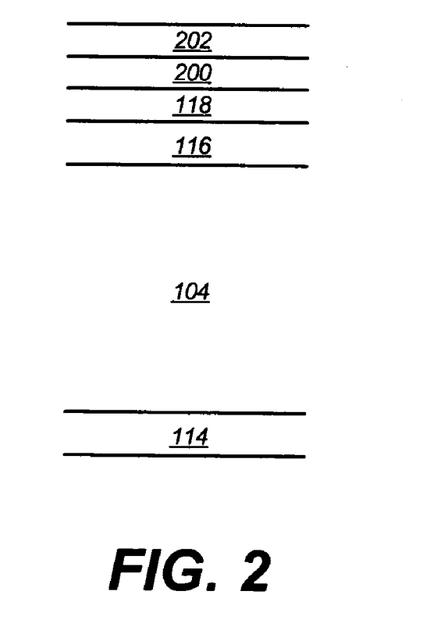
FIG. 2 is a schematic cross-sectional view of the base region of the SiGe HBT of FIG. 1.

FIG. 2 illustrates a schematic cross-sectional view of base region 104 (FIG. 1). Base region 104 includes base/collector spacer 114, base/emitter spacer 116, and silicon cap layer 118. Base region 104 can optionally include one or more additional silicon cap layers—e.g., silicon cap layers 200-202. Silicon cap layers 200-202 can be formed to include dopants and other properties similar to silicon cap layer 118 as discussed above.

Figure 3:
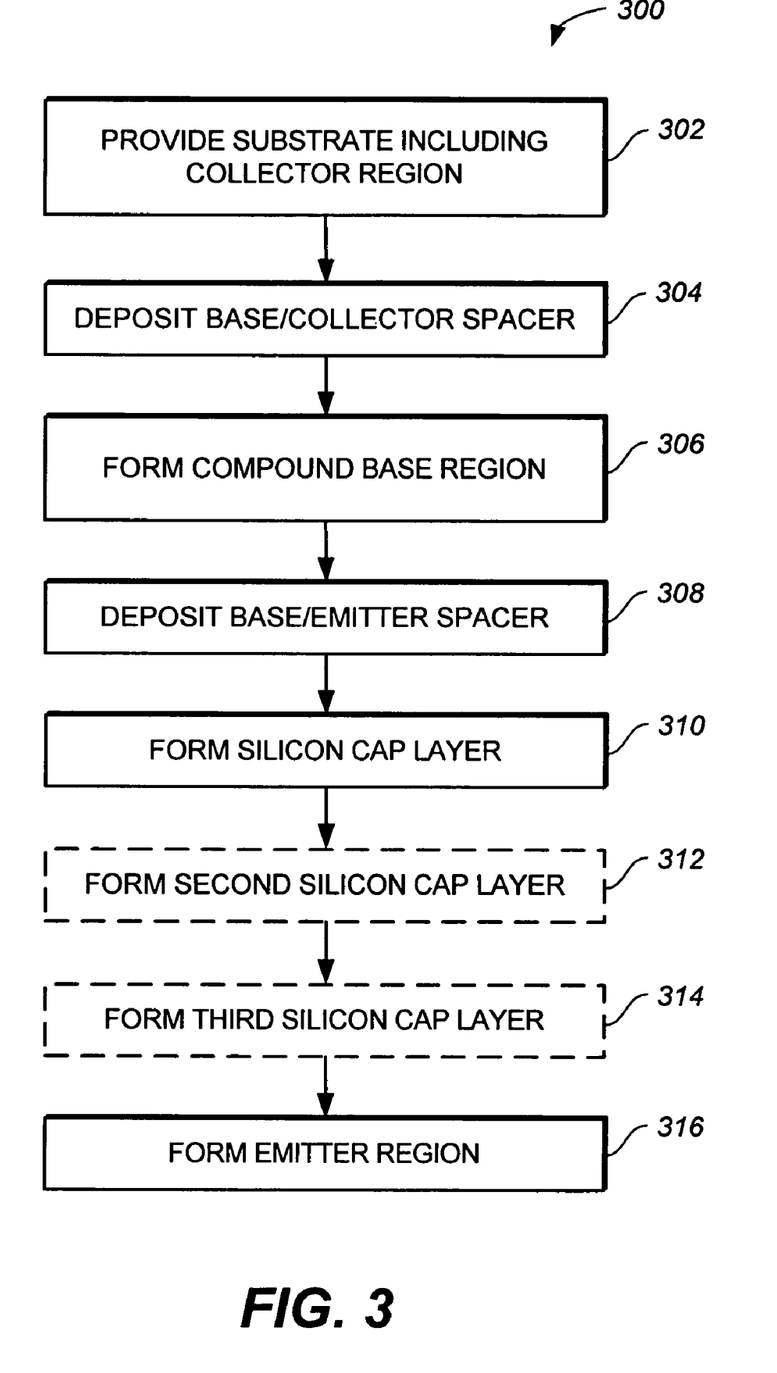
FIG. 3 is a flow diagram illustrating a process for fabricating an SiGe HBT.

FIG. 3 illustrates a process 300 of fabricating an HBT (e.g., SiGe HBT 100). Although process 300 is presented as a series of numbered steps for the purposes of clarity, no order should be inferred from the numbering.

Figure 4A:
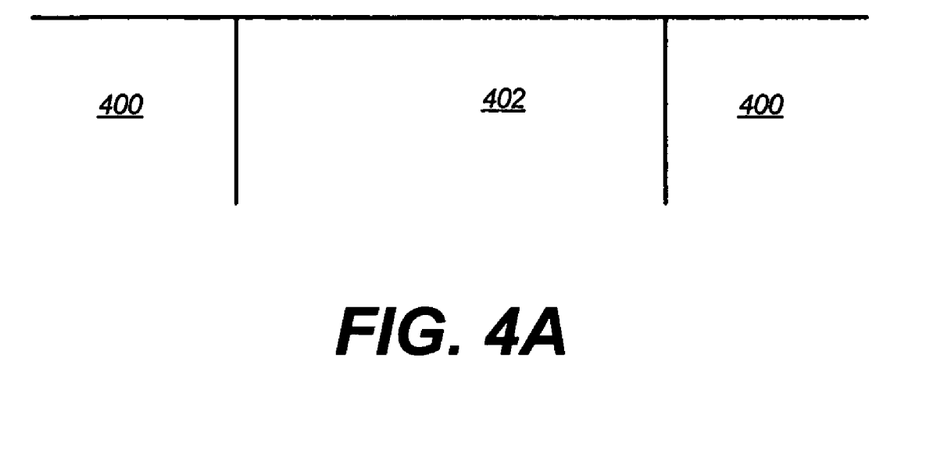
FIGS. 4A-4F illustrate the process of fabricating an SiGe HBT according to the process of FIG. 3.
Figure 4B:
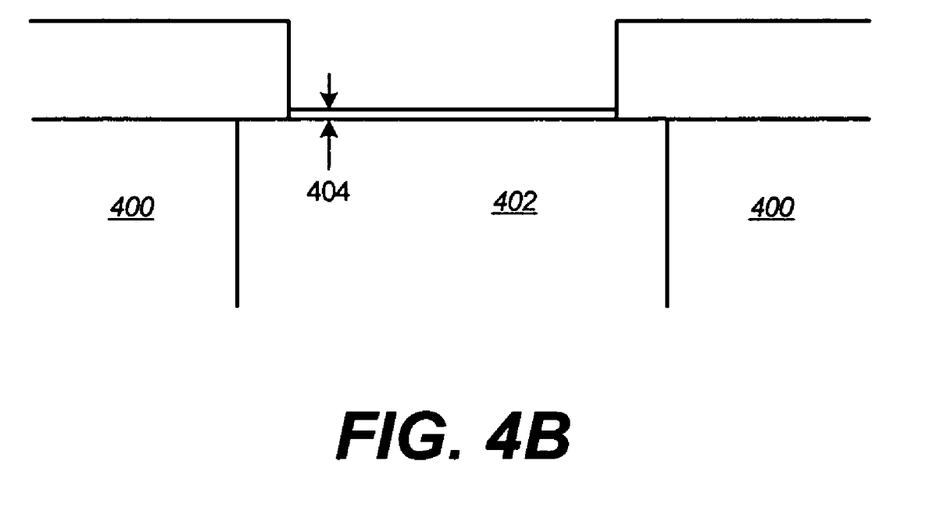
Figure 4C:
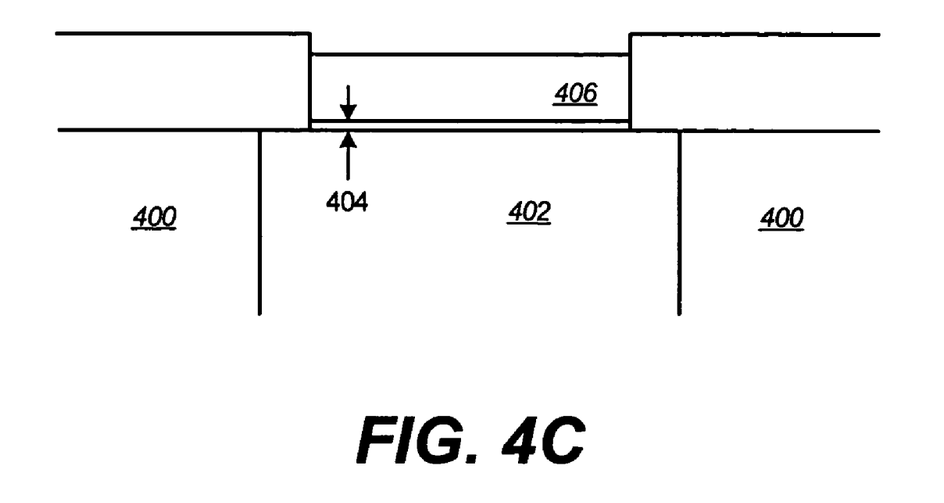
Figure 4D:
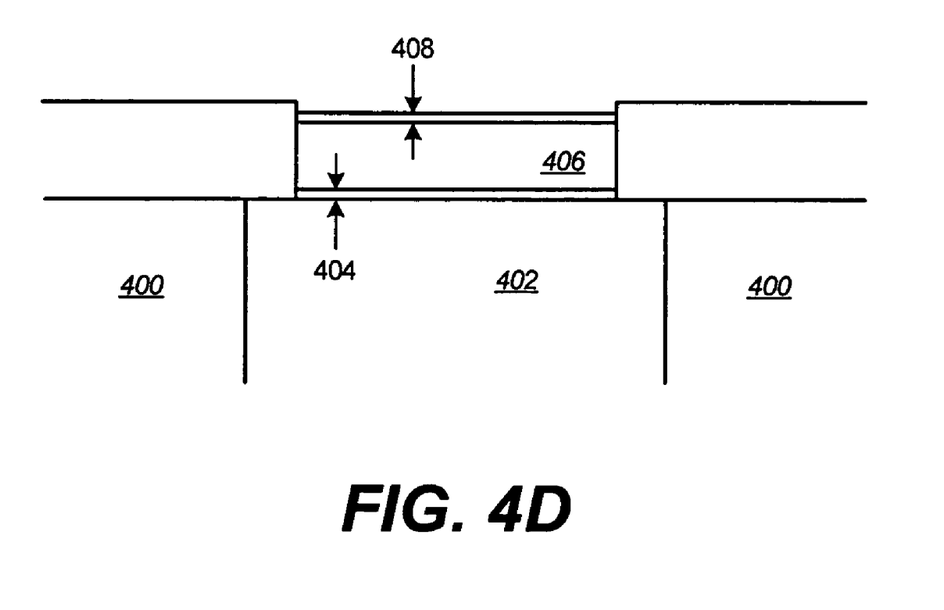

Process 300 begins with providing a substrate including a collector region (step 302). The substrate can be a p-type substrate or an n-type substrate. In one implementation, the collector region is doped n-type. Referring to the example of FIG. 4A, a p-type substrate 400 is provided including an n-type collector region 402. An n-type silicon and/or SiGe seed layer can further be formed over collector region 402 (not shown). A base/collector spacer is deposited over the collector region (step 304). The base/collector spacer can be n-type and/or undoped SiGe or Si. As shown in FIG. 4B, a base/collector spacer 404 is deposited over collector region 402. A compound base region is formed over the base/collector spacer (step 306). In one implementation, a p-type silicon germanium (SiGe) base region is formed. Referring to FIG. 4C, a p-type SiGe base region 406 is deposited over base/collector spacer 404. A base/emitter spacer is deposited over the SiGe base region (step 308). As with the base/collector spacer, the base/emitter spacer can be n-type and/or undoped SiGe. A base/emitter spacer 408 is deposited over SiGe base region 406 (FIG. 4D).

A mono-crystalline silicon cap layer is formed over the base/emitter spacer (step 310). In one implementation, the silicon cap layer is formed with process temperatures substantially ranging from 550° C. to 900° C. An n-type region of the silicon cap layer can be doped (in-situ) with phosphorus (P) or Arsenic (As). Gas sources that can be used during the growth process of the silicon cap layer include: SiH4 silicon source, GeH4 germanium source, CH3SIH3—carbon source, AsH3—arsenic source, PH3—phosphorus source, and hydrogen can be used as the carrier gas.

Figure 4E:
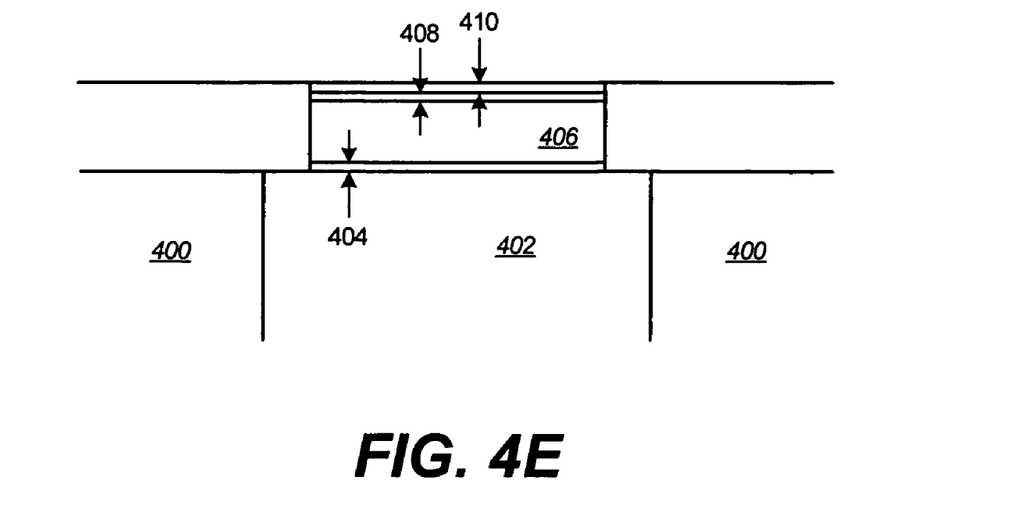

The silicon cap layer can also be doped (in-situ) by chemical vapor deposition (CVD) with diffusion modulating impurities, e.g., carbon (C), oxygen (O), or nitrogen (N); or any other diffusion modulating impurity that modifies interstitial and vacancy concentrations such as fluorine (F). In one implementation, carbon, nitrogen (N), fluorine (F), and/or oxygen levels are substantially in the range of 5E16 atoms/cc to 1E21 atoms/cc. Doping of the silicon cap layer can be implemented using ion implantation in lieu of CVD methods. Also, molecular beam epitaxy (MBE) and ultra high vacuum chemical vapor deposition (UHVCVD) can be implemented to form and dope the silicon cap layer. In addition, the silicon cap layer can be doped by diffusing n-type dopants (e.g., arsenic (AS) or phosphorus (P)) through the emitter layer to the silicon cap layer. Additionally, the silicon cap layer can be formed to have a predetermined width that permits a designer to tailor the amount of hole diffusion from base region 406 to an emitter region. Additionally, the designer can tailor the germanium (Ge) concentration and profile to accomplish a pre-determined amount of hole diffusion and base recombination current according to specific design constraints. Accordingly, as shown in FIG. 4E, a silicon cap layer 410 is formed over base/emitter spacer 408.

Figure 4F:
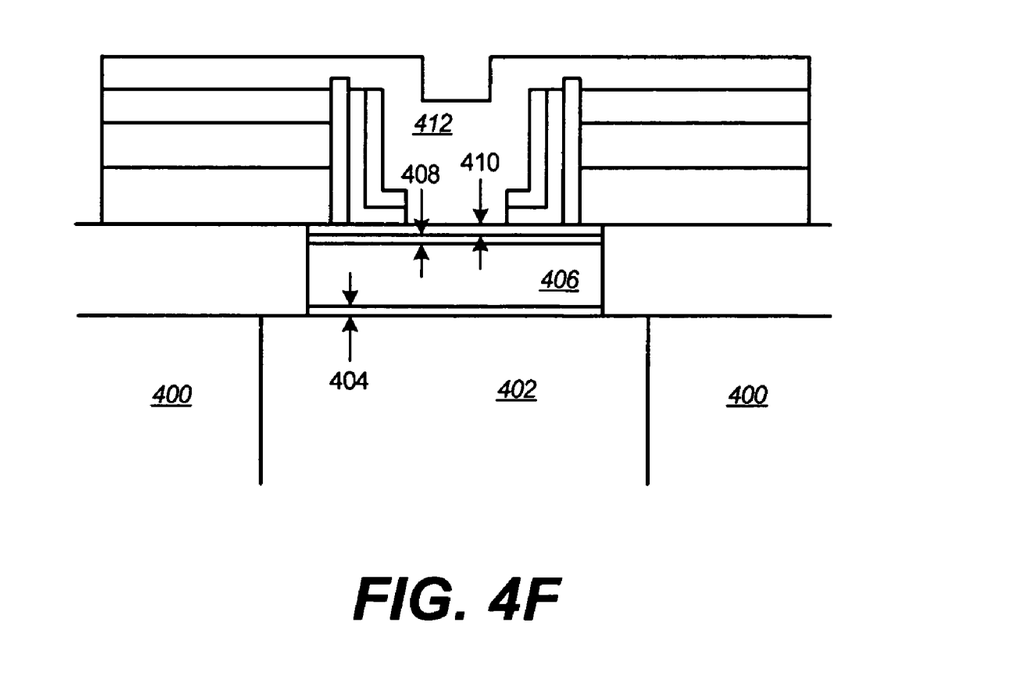

Optionally, second and third silicon cap layers are formed (steps 312-314). The second and third silicon cap layers can be formed to include properties similar to those discussed above in connection with step 310. An emitter region is formed over the silicon cap layer (step 316). As shown in FIG. 4F, an emitter region 412 is formed over silicon cap layer 410.

Equilibrium Band Diagrams

Figure 5A:
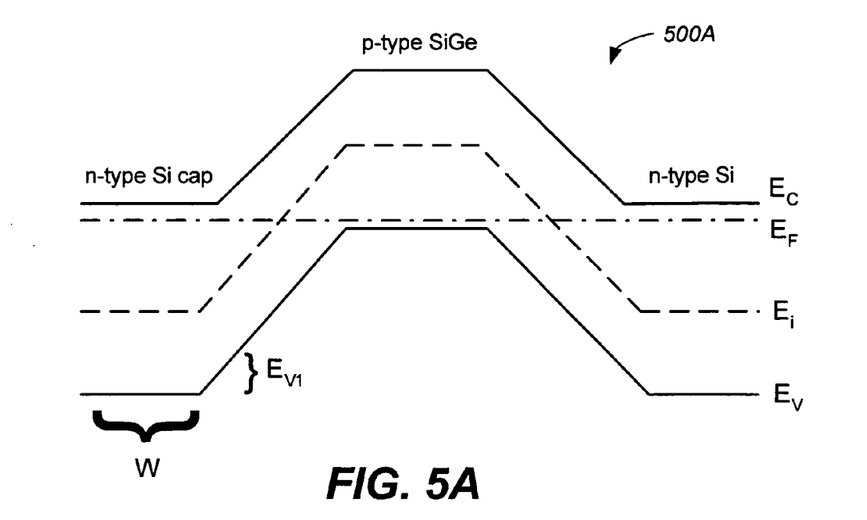
FIGS. 5A-5C illustrate band diagrams of an SiGe HBT in accordance with the present invention.

FIG. 5A illustrates a band diagram 500A of a typical NPN Si/SiGe/Si filmstack. Layers within the NPN Si/SiGe/Si filmstack of FIG. 5A include an n-type silicon or SiGe cap layer, a p-type SiGe base, and an n-type silicon seed layer. Band diagram 500A shows the conduction band (EC), the valence band (EV), the Fermi level (EF), and the intrinsic Fermi level (Ei). Also shown in band diagram 500A is the bandgap offset ($\Delta EV1$) (between the base and the emitter) that occurs mostly in the valence band (EV). This offset represents the difference in valence band energy that occurs when germanium (Ge) is added to the silicon lattice versus a silicon only cap layer.

Varying the percentage of germanium (Ge) and/or the width of the potential barrier—i.e., the silicon cap layer (n-type Si cap)—permits bandgap tailoring of the silicon cap layer and more specifically of the bandgap offset. An optimum barrier height and width for adjusting parameters such as base current, collector current, and current gain can be determined experimentally, and will also be a function of the germanium (Ge), arsenic (As), and phosphorus (P) dopant levels as well as the levels of the diffusion modulating impurities such as carbon (C) and oxygen (O).

Figure 5B:
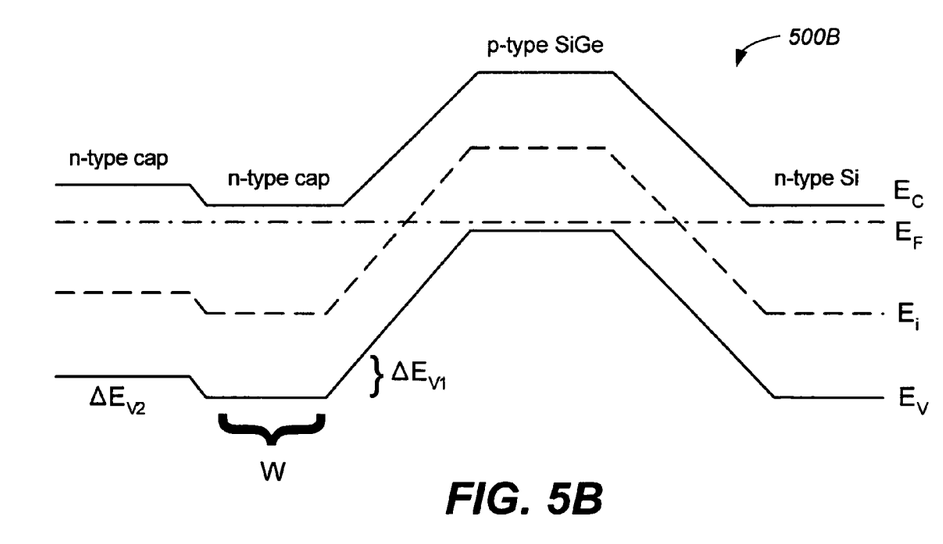

FIG. 5B illustrates a band diagram 500B of an NPN SiGe filmstack. Layers within the NPN SiGe filmstack of FIG. 5B include a first n-type silicon or SiGe cap layer, a second n-type silicon or SiGe cap layer, a p-type SiGe base, and an n-type silicon seed layer. Band diagram 500B illustrates dual bandgap offset structure ($\Delta EV1$ and $\Delta EV2$) separated by a distance (W). The bandgap offset magnitudes and a difference between $\Delta EV1$ and $\Delta EV2$ are generated by varying the percentage of germanium (Ge) within the first and/or second n-type silicon or SiGe cap layers.

Figure 5C:
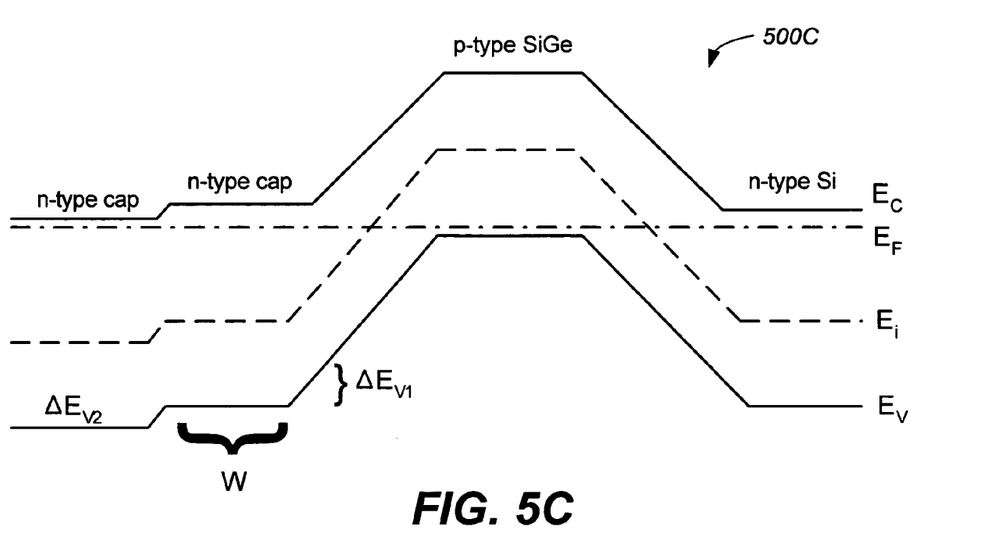

FIG. 5C illustrates a band diagram 500C of an NPN SiGe filmstack. Layers within the NPN SiGe filmstack of FIG. 5C include a first n-type silicon or SiGe cap layer, a second n-type silicon or SiGe cap layer, a p-type SiGe base, and an n-type silicon seed layer. Band diagram 500C illustrates another example of a dual bandgap offset structure ($\Delta EV1$ and $\Delta EV2$) separated by a distance (W).

Figure 6:
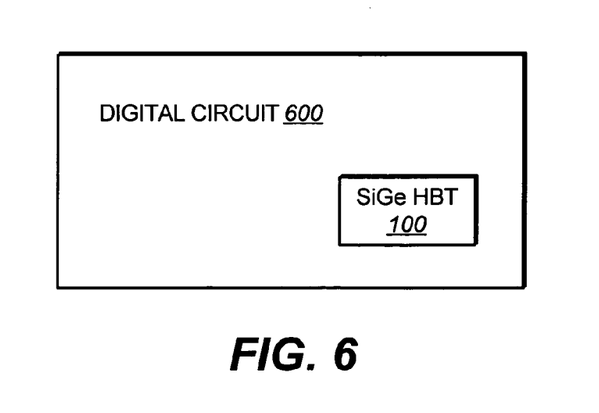
FIG. 6 illustrates a digital circuit including the SiGe HBT of FIG. 1.

An SiGe HBT according to the present invention (e.g., SiGe HBT 100) can be implemented within any type of digital circuit—e.g., digital circuit 600 as shown in FIG. 6. Digital circuit 600 can be associated with one or more of microcontrollers, memories, logic circuits, radio frequency (RF) components, sensors, communication systems, microwave devices, and the like.

Various implementations for fabricating an SiGe HBT have been described. Nevertheless, one or ordinary skill in the art will readily recognize that there that various modifications may be made to the implementations, and any variation would be within the spirit and scope of the present invention. For example, a silicon layer can be formed below the base region (e.g., base region 104) to include properties similar to a silicon cap layer (e.g., silicon cap layer 116) formed above the base region. Additionally, the germanium (Ge) profiles within these modified silicon regions (e.g., regions like silicon cap layer 116) can be tailored to have various shapes, such as for instance, box, trapezoid, triangular, or shapes with curvature. Accordingly, many modifications may be made by one of ordinary skill in the art without departing from the spirit and scope of the following claims.

We claim:

1. A method for fabricating a heterojunction bipolar transistor (HBT), the method comprising:
   providing a substrate including a collector region;
   forming a compound base region over the collector region;
   forming a cap layer overlying the compound base region including doping the cap layer with a pre-determined percentage of at least one element associated with the compound base region; and
   forming an emitter region over the cap layer,
   wherein forming a cap layer further includes doping the cap layer with a diffusion modulating impurity.

2. The method of claim 1, wherein the diffusion modulating impurity is an impurity which alters interstitial and vacancy concentrations with the cap layer.

3. The method of claim 1, wherein doping the cap layer with a diffusion modulating impurity includes doping the cap layer with carbon (C), oxygen (O), nitrogen (N), or fluorine (F).

4. The method of claim 3, wherein doping the cap layer with carbon (C), oxygen (O), nitrogen (N), or fluorine (F) includes doping the cap layer such that carbon (C), oxygen (O), nitrogen (N), or fluorine (F) levels are substantially in the range of 5E16 atoms/cc to 1E21 atoms/cc.

5. The method of claim 1, wherein forming a cap layer further includes doping the cap layer using a chemical vapor deposition method or ion implantation method.

6. A method for fabricating a heterojunction bipolar transistor (HBT), the method comprising:
   providing a substrate including a collector region;
   forming a compound base region over the collector region;
   forming a cap layer overlying the compound base region including doping the cap layer with a pre-determined percentage of at least one element associated with the compound base region; and
   forming an emitter region over the cap layer,
   wherein forming a cap layer includes forming the cap layer at a temperature substantially ranging from 550° C. to 900° C.

7. A method for fabricating a heterojunction bipolar transistor (HBT), the method comprising:
   providing a substrate including a collector region;
   depositing silicon germanium (SiGe) to form a base region over the collector region;
   forming a silicon cap layer overlying the base region including doping the silicon cap layer with a pre-determined percentage of germanium (Ge); and
   forming an emitter region over the silicon cap layer.

8. The method of claim 7, further comprising:
   forming a base/collector spacer between the base region and the collector region; and
   forming a base/emitter spacer between the base region and the emitter region.

9. The method of claim 7, wherein forming a silicon cap layer further includes doping the silicon cap layer with a diffusion modulating impurity.

10. The method of claim 9, wherein doping the silicon cap layer with a diffusion modulating impurity includes doping the silicon cap layer with carbon (C), oxygen (O), nitrogen (N), or fluorine (F).

11. The method of claim 10, wherein doping the silicon cap layer with carbon (C), oxygen (O), nitrogen (N), or fluorine (F) includes doping the silicon cap layer such that carbon (C), oxygen (O), nitrogen (N), or fluorine (F) levels are substantially in the range of 5E16 atoms/cc to 1E21 atoms/cc.

12. The method of claim 9, wherein forming a silicon cap layer further includes doping the silicon cap layer using a chemical vapor deposition method or ion implantation method.

13. The method of claim 7, wherein forming a silicon cap layer includes forming the silicon cap layer at a temperature substantially ranging from 550° C. to 900° C.

* * * * *